(12) United States Patent
Bang et al.

(10) Patent No.: US 12,133,041 B2
(45) Date of Patent: Oct. 29, 2024

(54) ELECTRONIC DEVICE INCLUDING OPENING AND CLOSING STRUCTURE

(71) Applicant: SAMSUNG ELECTRONICS CO., LTD., Suwon-si (KR)

(72) Inventors: Kyoungho Bang, Suwon-si (KR); Sungwook Kang, Suwon-si (KR); Junghyeon Kim, Suwon-si (KR); Jinyong Kim, Suwon-si (KR); Hangil Moon, Suwon-si (KR); Igor Ivanov, Suwon-si (KR); Byeongmin Lee, Suwon-si (KR); Jaeseong Lee, Suwon-si (KR); Hyung Lee, Suwon-si (KR); Joonrae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 17/698,866

(22) Filed: Mar. 18, 2022

(65) Prior Publication Data

US 2022/0256275 A1 Aug. 11, 2022

Related U.S. Application Data

(63) Continuation of application No. PCT/KR2022/001665, filed on Jan. 28, 2022.

(30) Foreign Application Priority Data

Feb. 10, 2021 (KR) ........................ 10-2021-0019373

(51) Int. Cl.
*H04R 1/10* (2006.01)
*H04R 1/08* (2006.01)
*H05K 5/02* (2006.01)

(52) U.S. Cl.
CPC ............. *H04R 1/1041* (2013.01); *H04R 1/08* (2013.01); *H04R 1/1016* (2013.01);
(Continued)

(58) Field of Classification Search
CPC ...... H04R 1/1041; H04R 1/08; H04R 1/1016; H04R 1/1075; H04R 1/1083; H04R 2460/11; H05K 5/0213
See application file for complete search history.

(56) References Cited

U.S. PATENT DOCUMENTS

| | | | |
|---|---|---|---|
| 8,295,505 B2 | 10/2012 | Weinans et al. | |
| 10,652,646 B2 | 5/2020 | Grinker | |

(Continued)

FOREIGN PATENT DOCUMENTS

| | | |
|---|---|---|
| CN | 1992989 | 7/2007 |
| EP | 3 471 433 | 4/2019 |

(Continued)

OTHER PUBLICATIONS

Search Report and Written Opinion issued May 13, 2022 in counterpart International Patent Application No. PCT/KR2022/001665.

(Continued)

*Primary Examiner* — Mark Fischer
(74) *Attorney, Agent, or Firm* — Nixon & Vanderhye, P.C.

(57) ABSTRACT

An electronic device according to various embodiments disclosed herein may include: a housing, a speaker embedded in the housing, an acoustic duct configured to transfer an output from the speaker to a user, an external hole formed in the housing to be connected to outside the electronic device, an external sound duct configured to transfer a sound introduced through the external hole to the user, and a variable hole member comprising a variable opening disposed in at least one of the external hole and the external (Continued)

sound duct, wherein the variable hole member may include a conductive member comprising a conductive material configured to apply an electric signal, a ventilation hole configured to allow a sound transferred from the external hole to pass therethrough, and a deformable member comprising a deformable material configured to deform based on the electric signal to close at least a portion of the ventilation hole.

6 Claims, 16 Drawing Sheets

(52) U.S. Cl.
CPC ......... *H04R 1/1075* (2013.01); *H04R 1/1083* (2013.01); *H05K 5/0213* (2013.01); *H04R 2460/11* (2013.01)

(56) References Cited

U.S. PATENT DOCUMENTS

| | | |
|---|---|---|
| 2007/0154050 A1 | 7/2007 | Kim |
| 2009/0285437 A1 | 11/2009 | Takigawa et al. |
| 2010/0061582 A1 | 3/2010 | Takigawa et al. |
| 2011/0019852 A1* | 1/2011 | Feucht .................. H04R 25/65 381/328 |
| 2012/0087511 A1 | 4/2012 | Lumsden et al. |
| 2014/0084396 A1 | 3/2014 | Jenkins et al. |
| 2016/0330537 A1* | 11/2016 | Barrentine ............ H04R 1/1008 |
| 2016/0353209 A1 | 12/2016 | Schelling et al. |
| 2019/0011643 A1 | 4/2019 | Lawand et al. |
| 2019/0116436 A1 | 4/2019 | Lawand et al. |
| 2020/0092662 A1 | 3/2020 | Wenzel |
| 2020/0196074 A1* | 6/2020 | Tiefenau .............. H04R 25/652 |
| 2020/0260197 A1* | 8/2020 | Thomsen ............... H04R 25/48 |
| 2021/0227315 A1* | 7/2021 | Wilmink .............. H04R 1/1041 |

FOREIGN PATENT DOCUMENTS

| | | |
|---|---|---|
| JP | 2010-004513 A | 1/2010 |
| KR | 10-0694160 | 3/2007 |
| KR | 10-1485005 B1 | 1/2015 |
| KR | 10-2016-0108842 | 9/2016 |
| KR | 10-2019-0028566 | 3/2019 |
| KR | 10-2162383 B1 | 10/2020 |

OTHER PUBLICATIONS

Partial Supplementary Search Report issued Apr. 30, 2024 in European Patent Application No. 22752921.1.

Extended Search Report dated Jul. 22, 2024 in European Patent Application No. 22752921.1.

* cited by examiner (a)

(b)

(a)

(b)

ELECTRONIC DEVICE INCLUDING OPENING AND CLOSING STRUCTURE

CROSS-REFERENCE TO RELATED APPLICATIONS

This application is a continuation of International Application No. PCT/KR2022/001665 designating the United States, filed on Jan. 28, 2022, in the Korean Intellectual Property Receiving Office and claiming priority to Korean Patent Application No. 10-2021-0019373, filed on Feb. 10, 2021, in the Korean Intellectual Property Office, the disclosures of which are incorporated by reference herein in their entireties.

BACKGROUND

Field

The disclosure relates to an audio electronic device including a structure capable of automatically opening/closing a path through which an external sound is transferred.

Description of Related Art

An audio electronic device refers to a device configured to receive an audio signal and to output a sound that can be heard by a user. Recently, audio electronic devices connected to an external electronic device in a wireless manner so as to output audio signals from the external electronic device, in order to remove the inconvenience of wireless connection, are commercially available.

There has been extensive development regarding an audio electronic device having a noise canceling function for blocking peripheral noise. The noise canceling function includes a function for outputting a sound corresponding to the inverse phase of peripheral noise such that the noise is removed through destructive interference. In order to correctly implement such a noise cancelling function, sound-blocking design for preventing peripheral sounds from reaching the user's ears may be important.

Audio devices having the noise canceling function may be designed, in order to maximize the noise canceling effect, in view of sound-blocking performance such that external environment sounds are blocked when the audio devices are worn by users.

Peripheral sounds may need to be heard, depending on the situation, by taking off the audio electronic device or using a separate microphone for receiving peripheral sounds.

Taking off the electronic device to hear peripheral sounds is inconvenient, and using a separate microphone for hearing peripheral sounds may have a problem in that it is difficult to provide natural peripheral sounds, and power is consumed to drive the microphone.

In addition, the user may be inconvenienced by a difference in atmospheric pressure between the inside and outside when an audio electronic device designed to block sounds is worn. There is also a problem in that it is difficult to secure a stage, thereby making it difficult to provide sounds that give realistic spatial impression.

SUMMARY

Embodiments of the disclosure may provide an audio electronic device having a structure such that peripheral sounds can be heard effectively while the noise canceling function is supported.

According to various example embodiments disclosed herein, an electronic device may include: a housing, a speaker embedded in the housing, an acoustic duct configured to transfer an output from the speaker to a user, an external hole provided in the housing connected to an outside of the electronic device, an external sound duct configured to transfer a sound introduced through the external hole to the user, and a variable hole member comprising an opening disposed in at least one of the external hole and the external sound duct, wherein the variable hole member includes a conductive member comprising a conductive material configured to apply an electric signal, a ventilation hole configured to allow a sound transferred from the external hole to pass therethrough, and a deformable member comprising a deformable material configured to deform based on the electric signal to close at least a portion of the ventilation hole.

According to various example embodiments disclosed herein, an electronic device may include: a housing, a speaker embedded in the housing, an acoustic duct configured to transfer an output from the speaker to a user, an external hole provided in the housing to be connected to an outside of the electronic device, an external sound duct configured to transfer a sound introduced through the external hole to the user, and a variable hole member comprising an opening disposed in at least one of the external hole and the external sound duct, wherein the variable hole member includes a ventilation hole configured to allow a sound transferred from the external hole to pass therethrough, a deformable member comprising a deformable material configured to deform by a pressure applied thereto to close at least a portion of the ventilation hole, and pressing members comprising an actuator configured to apply a pressure to the deformable member.

According to various example embodiments disclosed herein, an electronic device may include: an audio device including a speaker and a microphone, an external sound duct configured to transfer a sound introduced from outside the electronic device to the user, a variable hole member comprising an opening configured to close at least a portion of the external sound duct by an electric signal, and a processor operatively connected to the audio device and the variable hole member, wherein the processor is configured to: identify a configured acoustic mode and transmit a different electric signal to the variable hole member based on the acoustic mode, and wherein the variable hole member is configured to open the external sound duct or close at least a portion of the external sound duct based on the acoustic mode in response to the electric signal.

An electronic device according to various example embodiments disclosed herein may block peripheral sounds in order to improve the noise canceling effect in a noise canceling situation, and may automatically open a path through which peripheral sounds are transferred such that the peripheral sounds can be heard in a situation that requires peripheral sounds to be heard.

Improved usability may thus be provided through an adaptive response to various environments without having to take off the electronic device.

BRIEF DESCRIPTION OF THE DRAWINGS

The above and other aspects, features and advantages of certain embodiments of the present disclosure will be more apparent from the following detailed description, taken in conjunction with the accompanying drawings. In connection

DETAILED DESCRIPTION

Figure 1:
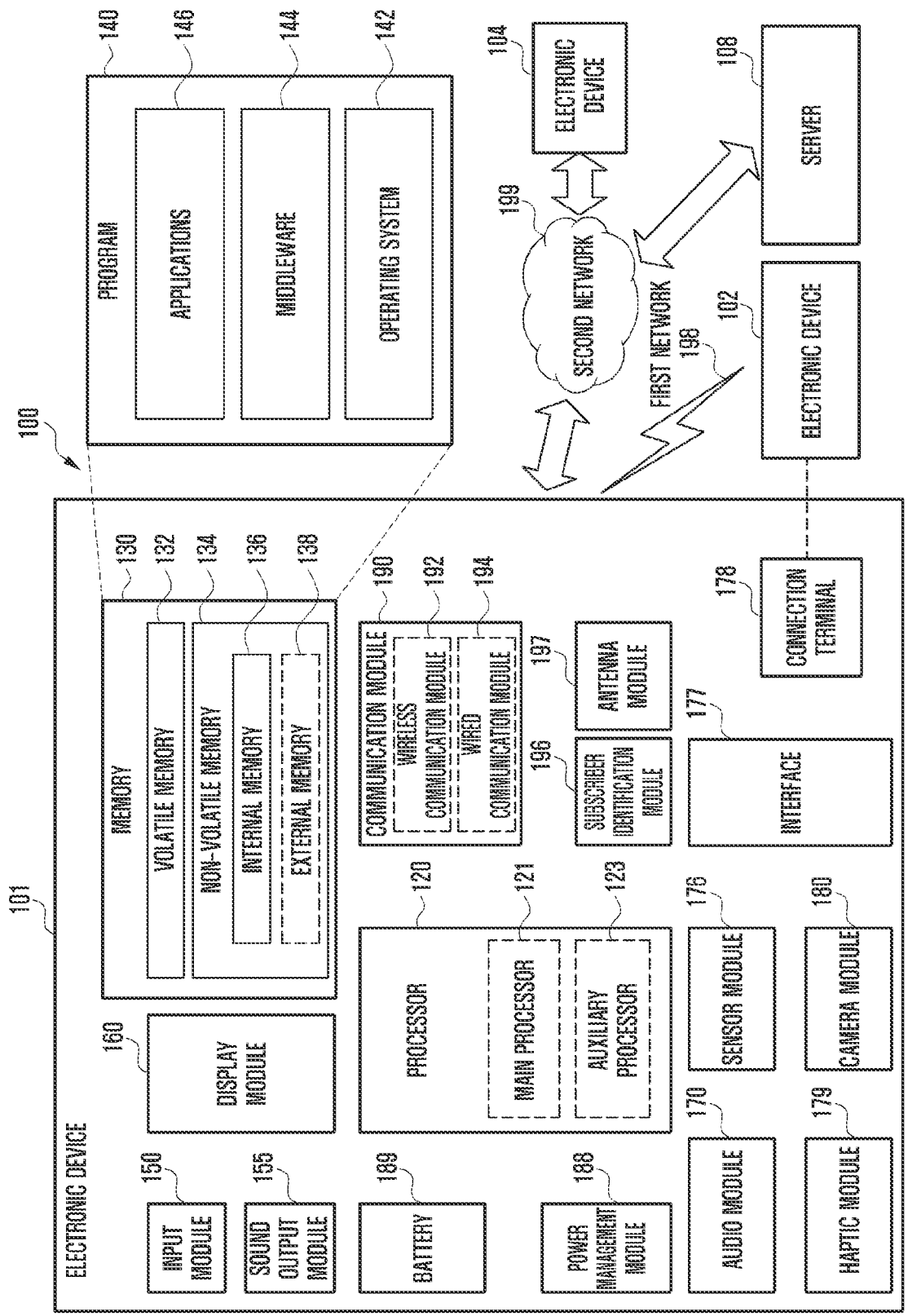
FIG. 1 is a block diagram illustrating an example electronic device in a network environment according to various embodiments.

It should be appreciated that various example embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element include a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
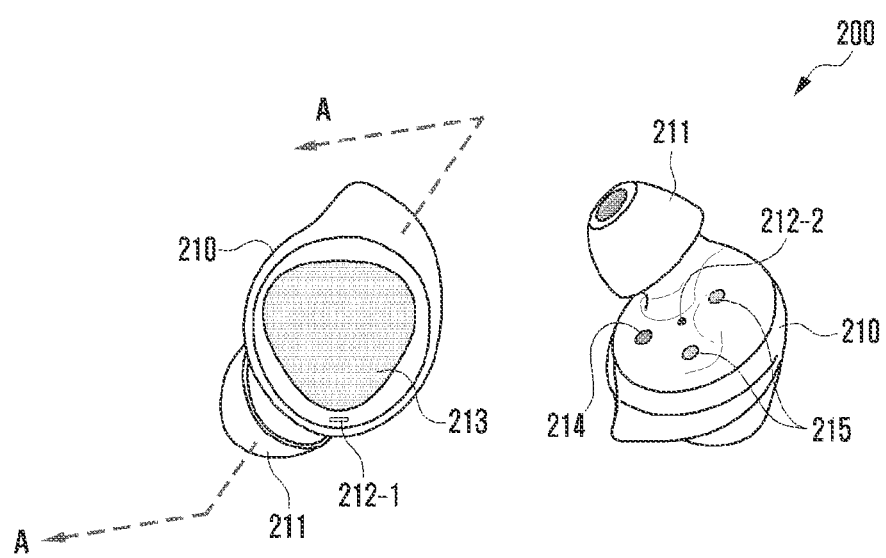
FIG. 2 is a perspective view of an electronic device according to various embodiments.
Figure 3A:
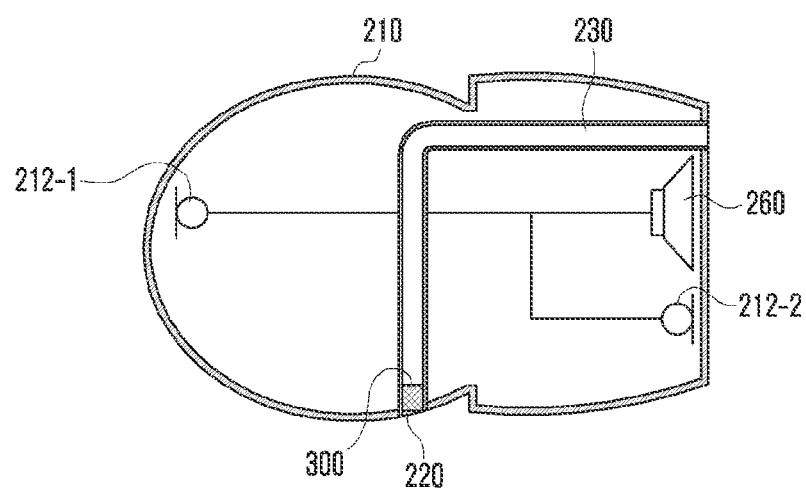
FIG. 3A is a diagram illustrating the electronic device illustrated in FIG. 2 according to various embodiments.
Figure 3A:
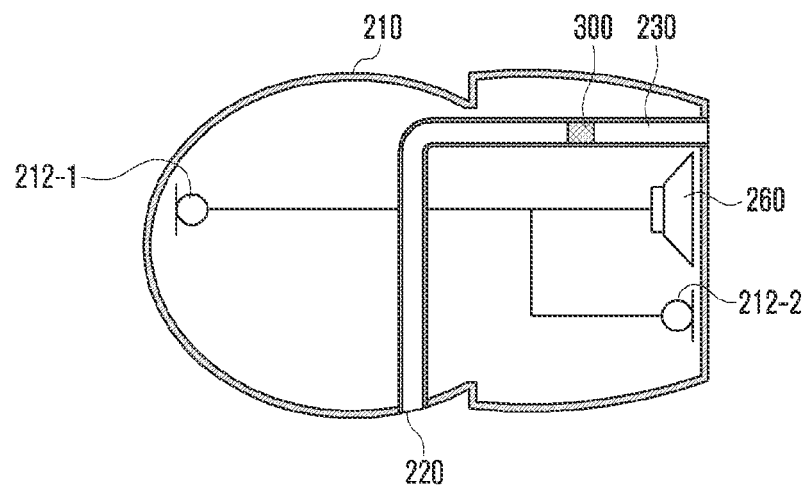
Figure 3B:
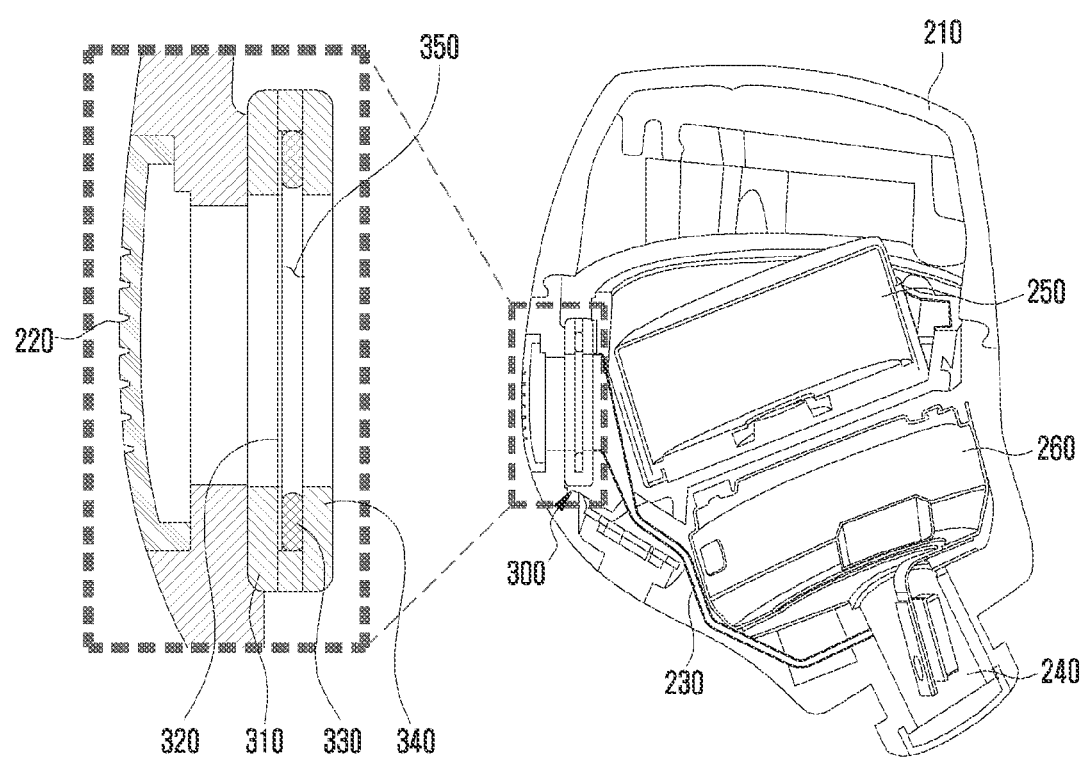
FIG. 3B and FIG. 3C are cross-sectional views of the electronic device illustrated in FIG. 2, taken along line A-A according to various embodiments.
Figure 3C:
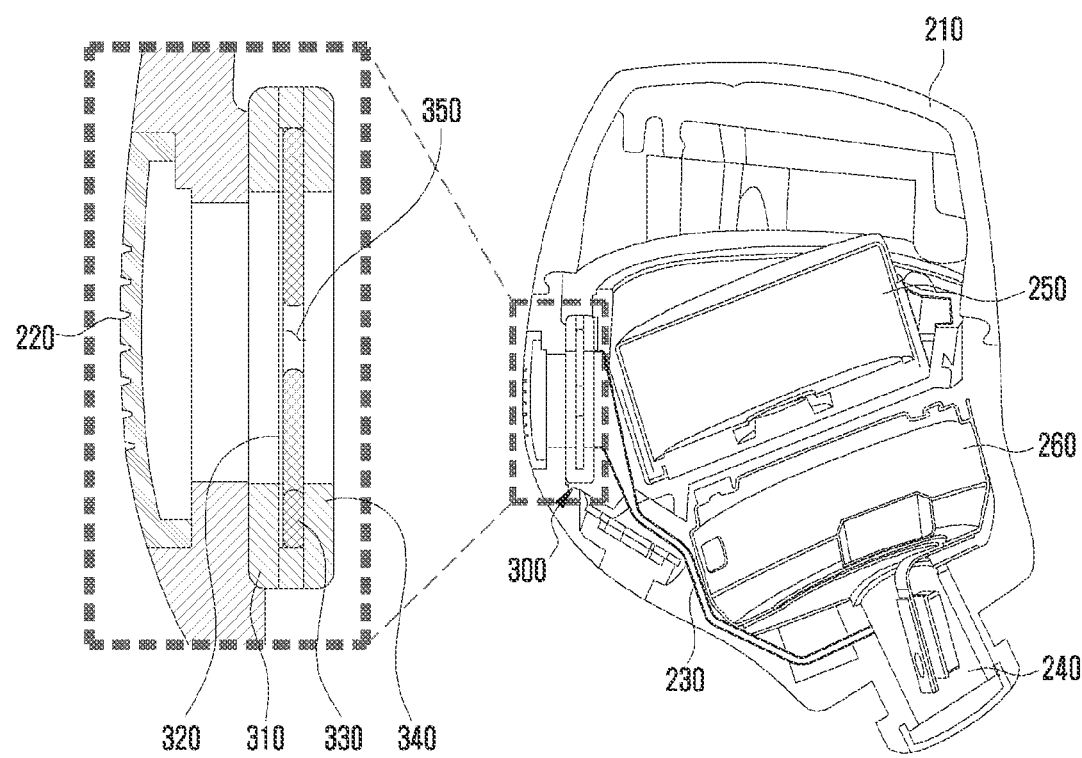

FIG. 2 is a perspective view illustrating an example electronic device according to various embodiments. FIG. 3A is a diagram illustrating the electronic device illustrated in FIG. 2 according to various embodiments. FIG. 3B and FIG. 3C are cross-sectional views of the electronic device illustrated in FIG. 2, taken along line A-A according to various embodiments.

According to various embodiments, the electronic device 200 of FIG. 2 may be an example of the electronic device 101 of FIG. 1 and an audio device for playing a sound. In a description below, even without specific reference, the electronic device 200 of FIG. 2 may include at least a portion of the components of the electronic device 101 illustrated in FIG. 1.

According to various embodiments, the electronic device 200 may be connected by wire or wireless to another electronic device and may play an audio signal transferred from the another electronic device. For example, the electronic device 200 may be connected to the another electronic device through a near field communication method (e.g.: Bluetooth, wireless fidelity (Wi-Fi) direct, infrared data association (IrDA), or the like) and may receive an audio signal using an audio signal transmission method supported by the corresponding communication method. Various other methods for connecting the electronic device 200 to the another electronic device may be employed in addition to the method described herein and the communication methods described above are merely examples and do not delimit the electronic device 200 thereto.

According to various embodiments, the electronic device 200 may include an audio device (e.g., audio module 170 in FIG. 1). The audio device may include a speaker 260 for outputting an audio signal and a microphone 212-1 or 212-2 for receiving a sound. The number of speakers 260 and microphones 212 may vary as necessary. According to an embodiment, the speakers 260 included in the electronic device 200 may include multiple speakers 260 accounting for different frequency bands from each other. In an embodiment, the microphone 212-1 or 212-2 may include an external microphone 212-1 for receiving a sound from outside the electronic device 200 and an internal microphone 212-2 for receiving a sound (e.g., reverberation or reverb) reflected from an ear portion of a user. In an embodiment, the internal microphone 212-2 may include, for sound detection, at least one air conduction microphone and/or at least one bone conduction microphone. The air conduction microphone may receive voice (e.g.: user's utterance) and output a voice signal corresponding to the detected voice. The bone conduction microphone may measure vibration of a bone (e.g., cranial bone) according to user utterance and output a voice signal corresponding to the measured vibration. The bone conduction microphone may be referred to as a bone conduction sensor or various other names A voice detected by the air conduction microphone may be a voice including an external noise mixed thereinto while a user utterance is transferred through air. A voice detected by the bone conduction microphone is a voice detected according to vibration of a bone and therefore, may be a voice having a less external noise introduction (e.g., effect of noise). Accordingly, the bone conduction microphone may output a voice signal less effected by an external noise. According to an embodiment, an acceleration sensor (not shown) may be used for obtaining a voice signal corresponding to a user voice less effected by an external noise. For example, the acceleration sensor may measure vibration of the skin of a user caused by a user utterance. The acceleration sensor may transfer a voice signal corresponding to the vibration of the skin to a processor (e.g.: processor 120 of FIG. 1). A voice (e.g., vibration) detected by the acceleration sensor may have a small amount of a noise introduction (e.g., effect of noise) from the outside due to detection through the vibration of the skin. The bone conduction microphone and/or the acceleration sensor described above may be referred to as a voice pickup unit (VPU) or various other names.

According to various embodiments, the electronic device 200 may include an input interface 213 capable of receiving a user input. The input interface 213 may include, for example, a physical interface (e.g., physical button, touch button) and a virtual interface (e.g., gesture, object recognition, voice recognition). In an embodiment, the electronic device 200 may include a touch sensor for detecting contact with the skin of a user. For example, referring to FIG. 2, an area (e.g., input interface 213) in which the touch sensor is disposed may be positioned at a portion of the electronic device 200. A user may apply an input by touching the area using a body portion. The touch input may include, for example, a single touch, multiple touches, a swipe, and/or a flick. According to an embodiment, when a single touch input is detected through the input interface 213, the electronic device 200 may play audio data or pause the playing. According to an embodiment, when a double touch input is detected through the input interface 213, the electronic device 200 may play next audio data. According to an embodiment, when a triple touch input is detected through the input interface 213, the electronic device 200 may play previous audio data. According to an embodiment, when a swipe input is detected through the input interface 213, the electronic device 200 may adjust a volume related to playing audio data. For example, the volume may increase according to an upward swipe input and decrease according to a downward swipe input. According to an embodiment, when a phone call is coming and a double touch input is detected through the input interface 213, the electronic device 200 may receive the phone call. According to an embodiment, the touch recognition through the interface 213 may be performed in various manners. For example, the touch input may be recognized by at least one method from among capacitive, resistive, infrared or ultrasonic method. In an embodiment, the electronic device 200 may include a physical button or an optical key.

According to various embodiments, the electronic device 200 may include a proximity sensor 214 and a connection terminal 215. The proximity sensor 214 may be, for example, a sensor capable of identifying whether a specific object is near using infrared light. The proximity sensor 214 may be used to identify whether the electronic device 200 is worn on an ear of the user. The connection terminal 215 may be a conductive member 320 for charging the electronic device 200 or transmitting data. The connection terminal 215 may be in contact with a terminal included in an external device (e.g.: case, charging adapter). When a charging device is electrically connected to the electronic device 200 through the connection terminal 215, a battery 250 may be charged or data is transmitted.

According to various embodiments, the electronic device 200 may include a housing 210 having a shape of which at least a portion may be inserted into a user ear. An elastically deformable ear cap 211 may be detachably coupled to a portion of the housing 210. The ear cap 211 may contract during a process of inserting the same into the user ear, and partially restored in the user ear to allow the electronic device 200 to be held in the user ear, so that the inside the user ear may be blocked from the outside. The electronic device 200 described herein may include a kernel type or an open type, which are usually used in the audio field. Furthermore, the electronic device 200 may be changed to various shapes. The shape of the electronic device 200 shown in FIG. 2 is a mere example, and the shape of the electronic device 200 described below is not limited thereto.

Referring to FIGS. 3A, 3B and 3C, the electronic device 200 may include an acoustic duct 240 and an external sound duct 230. The acoustic duct 240 and the external sound duct 230 may be understood as a path formed in the housing 210 of the electronic device 200, through which a sound is transferred. The acoustic duct 240 and the external sound duct 230 may be separately formed using a material different from that of the housing 210, and disposed in the electronic device 200. In an embodiment, the acoustic duct 240 may be referred to as a path configured to connect the user ear to a speaker 260 in a state in which the electronic device 200 is worn. A sound output from the speaker 260 may be transferred to the user ear via the acoustic duct 240.

According to various embodiments, the external sound duct 230 may be understood as a path configured to connect the outside of the electronic device 200 to the user ear. In a state in which the electronic device 200 is worn, a sound or air of the outside may be moved into the user ear through the external sound duct 230 via the electronic device 200. The external sound duct 230 is a path configured to connect the outside and the ear, and therefore, the external sound duct 230 may mitigate a pressure increase which may be caused by wearing the electronic device 200. According to various embodiments, the external sound duct 230 may be formed separately from the acoustic duct 240 and may be connected to the acoustic duct 240.

According to various embodiments, an external hole 220 may be an opening formed through the housing 210 of the electronic device 200 to allow a sound and air of the outside to be introduced into the external sound duct 230. The external hole 220 may have a waterproof member or a foreign substance blocking member disposed therein to prevent and/or reduce moisture or a foreign substance from being introduced to the external sound duct 230. For example, a mesh structure may be positioned in the external hole 220 to block a foreign substance larger than a specific size from being introduced into the external sound duct 230.

According to various embodiments, a variable hole member 300 may be disposed adjacent to the external hole 220 as shown in (a) of FIG. 3A, FIG. 3B, and FIG. 3C. Furthermore, the variable hole member 300 may be disposed in the external sound duct 230 as shown in (b) of FIG. 3A. In some cases, multiple variable hole members 300 may be arranged in the external hole 220 and the external sound duct 230. The variable hole member 300 may close a portion of the external hole 220 or the external sound duct 230 by an electric signal applied to the variable hole member 300. For example, referring to FIG. 3B and FIG. 3C, the variable hole member 300 may be identified to close a portion of the external hole 220 and the external sound duct 230. The operation of the variable hole member 300 will be described in detail below.

In the description below, the same or similar component as those of FIG. 2, and FIGS. 3A, 3B and FIG. 3C will be given the same or similar reference numbers for description.

Figure 4A:
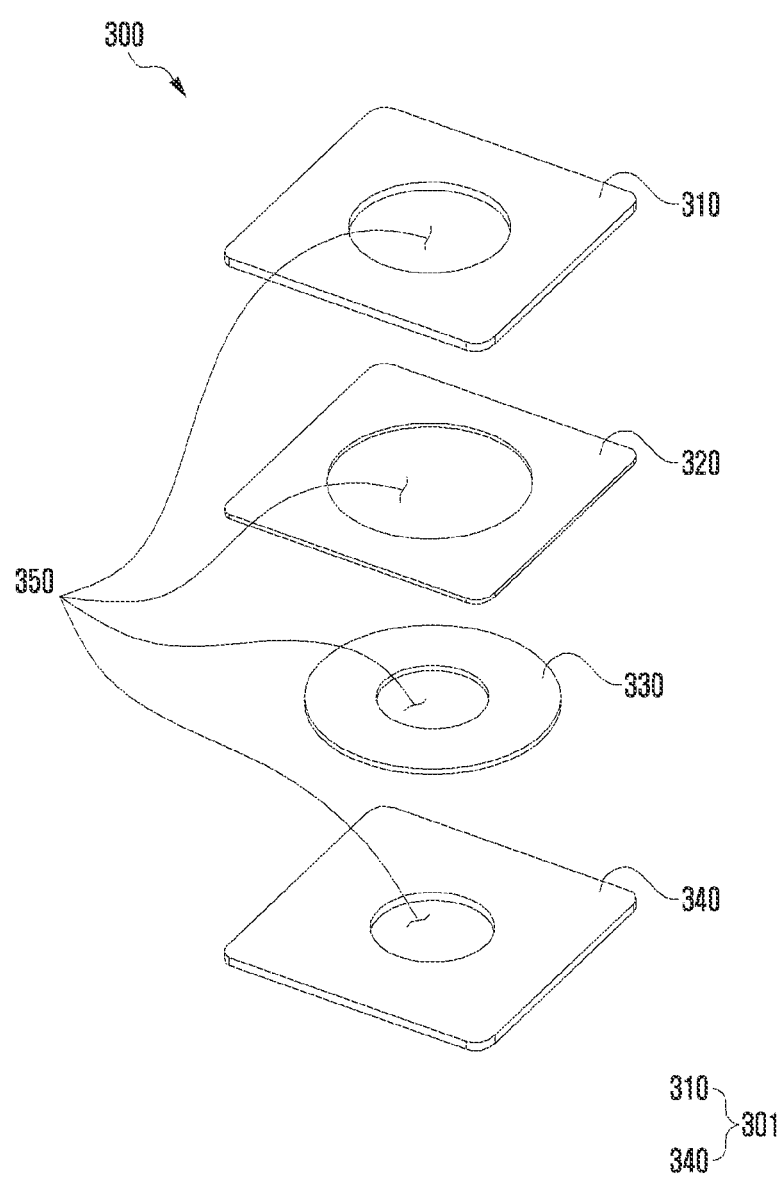
FIG. 4A is an exploded perspective view illustrating a variable hole member according to various embodiments.
Figure 4B:
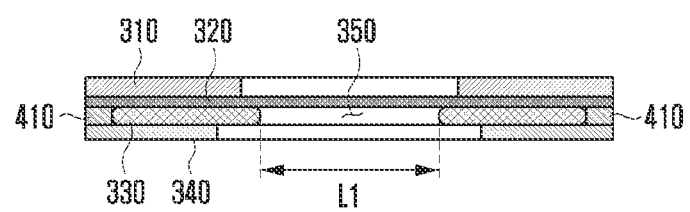
FIG. 4B is a cross-sectional view illustrating an example operation of a variable hole member according to various embodiments.
Figure 4B:
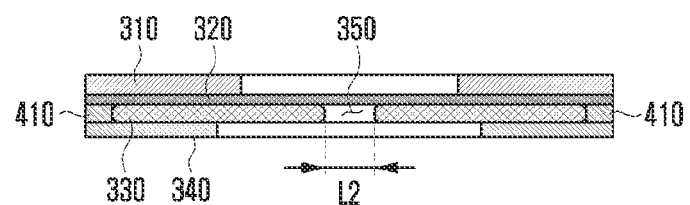

FIG. 4A is an exploded perspective view illustrating a variable hole member according to various embodiments. FIG. 4B is a cross-sectional view illustrating an example operation of a variable hole member according to various embodiments. Hereinafter, the description will be made referring to FIG. 3B and FIG. 3C together.

According to various embodiments, the variable hole member 300 may include a conductive member 320, a ventilation hole 350, a deformable member 330, and a body part (e.g., body) 301.

According to various embodiments, the deformable member 330 may be formed by a deformable material configured to deform according to an electric signal. For example, the deformable member 330 may be formed of a polymer material expanding and contracting by an electric signal. For another example, the deformable member 330 may be formed of a material having an attribute by which an internal ion is moved by an electric signal and an area having the ion having moved thereto expands. For still another example, the deformable member 300 may be formed to have an additional shape therein so as to facilitate ion conduction or pressure transference.

According to various embodiments, the conductive member 320 may be a component configured to apply an electric signal to the deformable member 330. The conductive member 320 may be formed of a conductive material to transmit an electric signal. The conductive member 320 may transfer an electric signal to the deformable member 330 according to control of a processor (e.g.: processor 120 of FIG. 1) of the electronic device 200.

According to various embodiments, a body part (e.g., body or support) 301 may be a component configured to entirely support the deformable member 300. In an embodiment, the body part 301 may include multiple plates. For example, as shown in FIG. 4A, the body part 301 may include a first plate 310 and a second plate 340 with the conductive member 320 and the deformable member 330 interposed therebetween. Referring FIG. 4A and FIG. 4B, the variable hole member 300 may include a structure in which the first plate 310—the conductive member 320—the deformable member 330—the second plate 340 are stacked. In an embodiment, the second plate 340 adjacent to the deformable member 330 may be formed of a conductive material. For example, the second plate 340 may be connected to a ground of the electronic device 200 to function as a ground for an electric signal transferred to the conductive member 320. According to an embodiment, the variable hole member 300 may vary a stacking order thereof. For example, the variable hole member 300 may include a structure in which the first plate 310—the deformable member 330—the conductive member 320—the second plate 340 are sequentially stacked. For another example, the variable hole member 300 may include a structure in which the first plate 310—the conductive member 320—the deformable member 330—the conductive member 320—the second plate 340 are sequentially stacked. According to an embodiment, the variable hole member 300 may be disposed on the same plane as the conductive member 320 and the deformable member 330.

According to various embodiments, the ventilation hole 350 may be an opening connected to the external sound duct 230. In an embodiment, the ventilation hole 350 may be referred to an opening formed through the body part 301, the conductive member 320, and/or the deformable member 330. When the variable hole member 300 is disposed in the external hole 220 or the external sound duct 230, an external sound may pass through the variable hole member 300 via the ventilation hole 350 of the external sound duct 230.

Referring to FIG. 4B, the deformable member 330 may contract (e.g.: (a) of FIG. 4B) or expand (e.g.: (b) of FIG. 4B) by an electric signal applied to the deformable member 330. The contraction and expansion may be referred to a relative degree of deformation. For example, the deformable member 330 may only contract or may only expand from a reference shape. In the description below, the deformation of the deformable member 330 for closing a portion of the ventilation hole 350 is defined as an expansion and the deformation of the deformable member 330 for opening the ventilation hole 350 is defined as a contraction.

According to various embodiments, the deformable member 330 may expand according to an electric signal applied to the deformable member 330. In this case, a size (area or diameter) of the opening formed through the deformable member 330 may decrease. The opening of the deformable member 330 is the ventilation hole 350 and thus the size (area or diameter) of the ventilation hole 350 may decrease by the expansion of the deformable member 330 (e.g., from L1 to L2 in FIG. 4B). The ventilation hole 350 is a path through which an external sound passes, and therefore, when the size of the ventilation hole 350 decreases, the external sound transferred to the user ear may decrease. The deformable member 330 may contract according to an electric signal applied to the deformable member 330. In this case, the size of the opening of the deformable member 330 increases and thus the size of the ventilation hole 350 may increase as well. When the size of the ventilation hole 350 increases, the external sound transferred to the user ear may increase.

The description is made to the expansion or contraction of the deformable member 330 according to an electric signal application, but for the case in which the deformable member 330 undergoes only the expansion, the blocking of an electric signal may cause the deformable member 330 to be back to the original shape. For the case in which the deformable member 330 undergoes only the contraction, the blocking of an electric signal may cause the deformable member 330 to be back to the original shape. In some cases, the deformable member 330 having been deformed by the electric signal application may maintain the deformation for a certain level even after the electric signal is blocked.

According to various embodiments, the variable hole member 300 may include a partition wall member 410 configured to guide a deformation direction of the deformable member 330 to increase or decrease the size of the ventilation hole 350 by the deformation of the deformable member 330. For example, the opening of the deformable member 330 may be positioned at the center of the variable hole member 300 as shown in FIG. 4A and FIG. 4B. In this case, the partition wall member 410 may be disposed at an outer circumferential portion of the deformable member 330 so as to guide the deformation of the deformable member 330 to increase or decrease the size of the opening positioned at the center thereof. In an embodiment, the partition wall member 410 may be a housing 210 of the electronic device 200. When the variable hole member 300 is disposed in the housing 210 of the electronic device 200, an inner wall of the housing 210 may function as the partition wall member 410.

Figure 5A:
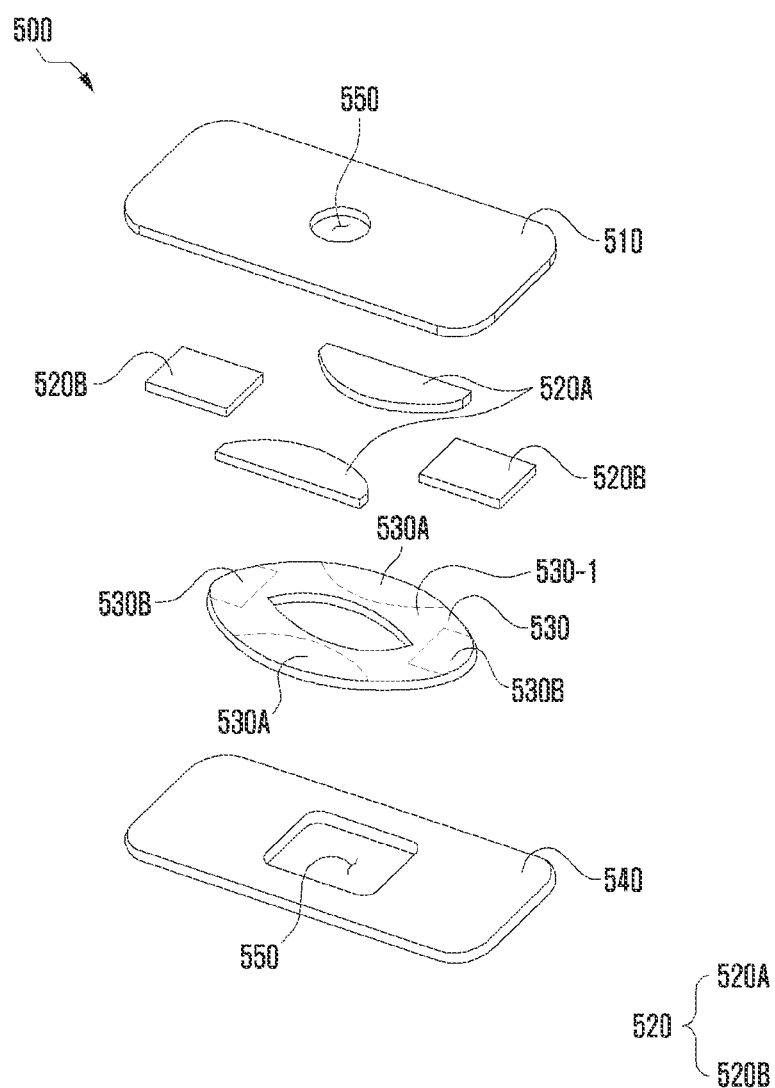
FIG. 5A is an exploded perspective view illustrating a variable hole member according to various embodiments.
Figure 5B:
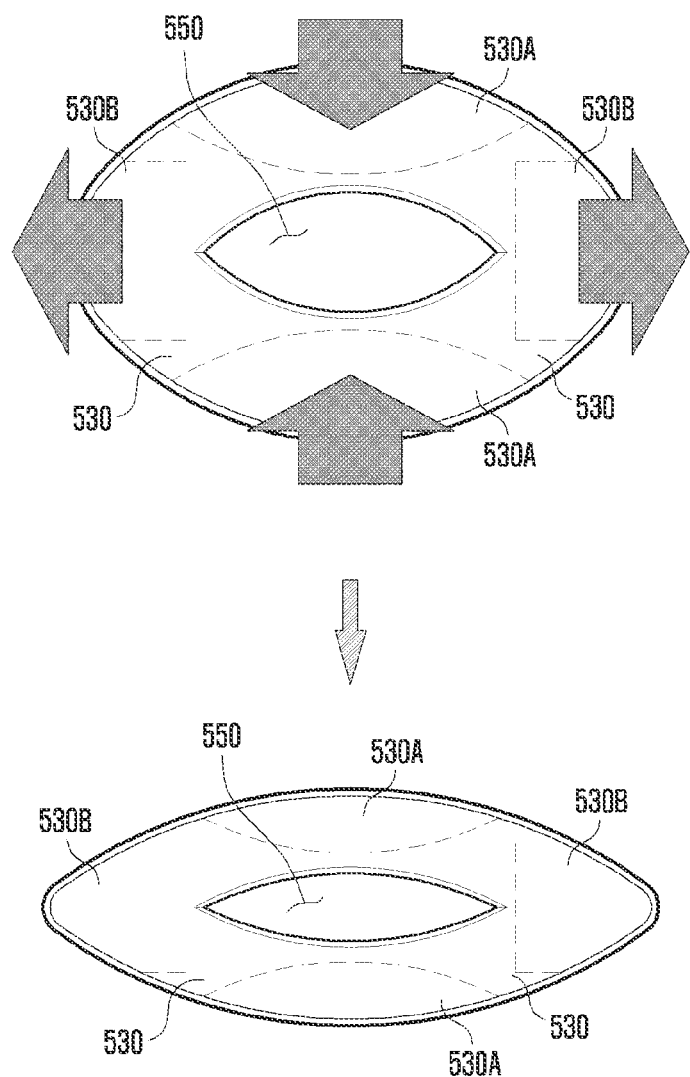
FIG. 5B is a cross-sectional view illustrating an example operation of a variable hole member according to various embodiments.

FIG. 5A is an exploded perspective view illustrating a variable hole member 500 according to various embodiments. FIG. 5B is a cross-sectional view illustrating an example operation of a variable hole member according to various embodiments.

According to various embodiments, a variable hole member 500 (e.g., variable hole member 300 of FIG. 3A) may include a conductive member 520, a ventilation hole 550, a deformable member 530, and a body part (e.g. body or support) 510 or 540.

According to various embodiments, the conductive member 520 may be formed of multiple conductive members 520a and 520B segmented from each other. For example, the conductive member 520 may include a first conduction part 520A and a second conduction part 520B configured to transfer different electric signals. In this case, the conductive member 520 may apply different electric signals to different areas of the deformable member 530. In an embodiment, the first conduction part 520A may be disposed adjacent to a first area 530A in a first surface 530-1 of the deformable member 530 which is in contact with the first conduction part 520A so as to apply a first signal to the first area 530A. The second conduction part 520B may apply a second signal different from the first signal to a second area 530B different from the first area 530A in the first surface 530-1. The first signal and the second signal may be signals electrically corresponding or opposite to each other. In an embodiment, the first signal may be a signal corresponding to (+) voltage and the second signal may be a signal corresponding to (−) voltage. As described above, by applying different electric signals to different areas of the deformable member 530, the deformable member 530 may be deformed differently for each area. In an embodiment, the first conduction part 520A may be disposed adjacent to the first area 530A in the first surface 530-1 of the deformable member 530 which is in contact with the first conduction part 520A and the second conduction part 520B in the second surface (not shown) positioned opposite to the first surface 530-1 may apply the second signal different from the first signal to the second area 530B.

According to various embodiments, the deformable member 530 may have an ellipse shape as shown in FIG. 5A and FIG. 5B. In this case, the first conduction part 520A of the conductive member 520 may apply the first signal to an area corresponding to the major axis of the deformable member 530 and the second conduction part 520b may apply the second signal to an area corresponding to the minor axis of the deformable member 530. As shown in FIG. 5B, when electric signals are adjusted so that the area corresponding to the minor axis of the deformable member 530 expands and the area corresponding to the major axis contracts, the ventilation hole 550 may be efficiently opened or closed using less energy.

Figure 6A:
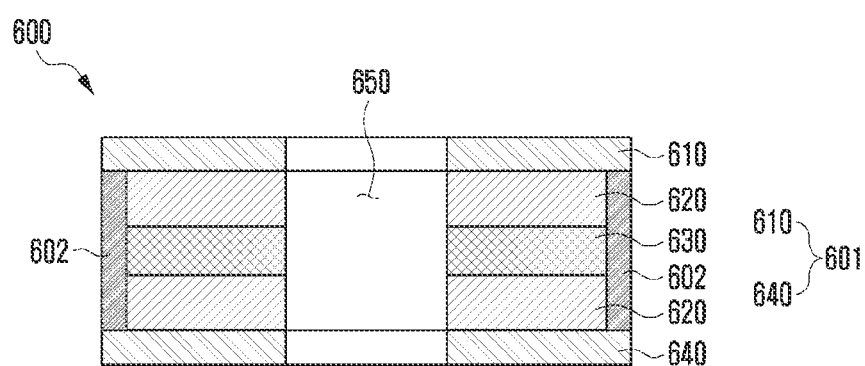
FIGS. 6A and 6B are cross-sectional views illustrating a variable hole member according to various embodiments.
Figure 6B:
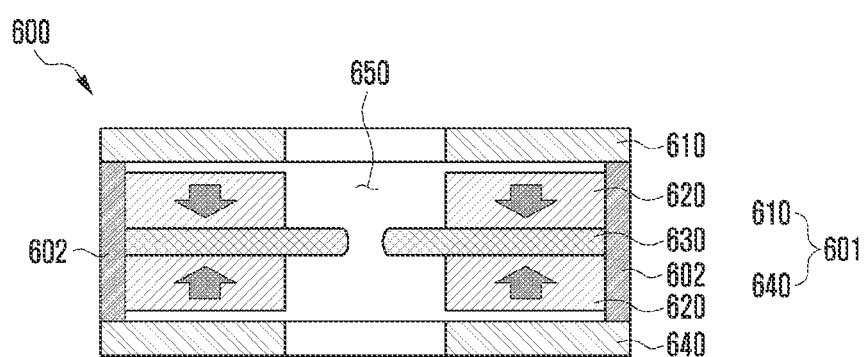

FIGS. 6A and 6B are cross-sectional views illustrating a variable hole member according to various embodiments. Hereinafter, the description will be made referring to FIG. 3B and FIG. 3C together.

According to various embodiments, a variable hole member 600 (e.g.: variable hole member 300 of FIG. 3A) may include a pressing member 620, a ventilation hole 650, a deformable member 630, and a body part (e.g., body or support) 601.

According to various embodiments, the deformable member 630 may be formed of a material easily deformed by an external force. The deformable member 630 may be formed of a material high in deformation or elasticity. For example, the deformable member 630 may be formed of a gel-type material filled with a polymer material having high elasticity.

According to various embodiments, the pressing member 620 may be a component operated by an electric signal to press the deformable member 630. The pressing member 620 may be an actuator. The pressing member 620 may include various actuators. For example, the pressing member 620 may include various actuators such as a hydraulic or pneumatic motor, a linear motor, a piezo motor, an electromagnet motor, a voice coil motor, and the like.

According to various embodiments, a body part or support 601 may be a component configured to entirely support the deformable member 600. In an embodiment, the body part 601 may include multiple plates. For example, the body part 601 may include a first plate 610 and a second plate 640 with the pressing member 620 and the deformable member 630 interposed therebetween.

According to various embodiments, the ventilation hole 650 may be an opening connected to the external sound duct 230. In an embodiment, the ventilation hole 650 may be referred to an opening formed through the body part 601, the pressing member 620, and the deformable member 630. When the variable hole member 600 is disposed in the external hole 220 or the external sound duct 230, an external sound may pass through the variable hole member 600 via the ventilation hole 350 of the external sound duct 230.

According to an embodiment, a waterproof member (not shown) may close a portion of the ventilation hole 650 to prevent and/or reduce moisture or a foreign substance from being introduced into an inner space of the electronic device 200 through the ventilation hole 650. The waterproof member may prevent and/or reduce moisture or a foreign substance from passing through the ventilation hole 650 without effecting on sound transference. For example, the waterproof member may include a mesh structure. In an embodiment, the waterproof member may be disposed in an opening formed through the first plate 610 and/or the second plate 620, or may be disposed on an outer surface of the first plate 610 and/or the second plate 620. In addition, the waterproof member may be disposed in the external hole 220 and/or the external sound duct 230 connected to the ventilation hole 650.

According to various embodiments, the deformable member 630 may be interposed between the pressing members 620. When the pressing member 620 press the deformable member 630, the deformable member 630 may be elastically deformed. The elastically deformed deformable member 630 may close a portion of the external sound duct 230 by decreasing the size of the ventilation hole 650.

According to various embodiments, the variable hole member 600 may include a partition wall member 602 for guiding a deformation direction of the deformable member 630 to increase or decrease the size of the ventilation hole 650 by the deformation of the deformable member 630. For example, the opening of the deformable member 630 may be positioned at the center of the deformable member 630. In this case, the partition wall member 602 may be disposed at an outer circumferential portion of the deformable member 630 so as to guide the deformation of the deformable member 630 to increase or decrease the size of the opening positioned through the center thereof. In an embodiment, the partition wall member 602 may be a housing 210 of the electronic device 200. When the variable hole member 600 is disposed in the housing 210 of the electronic device 200, an inner wall of the housing 210 may function as the partition wall member 602.

Figure 7:
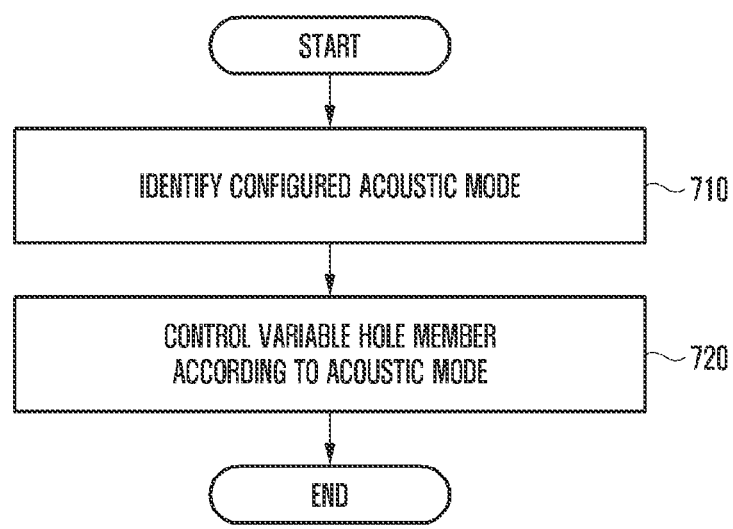
FIG. 7 is a flowchart illustrating an example operation of a variable hole member according to various embodiments.
Figure 8:
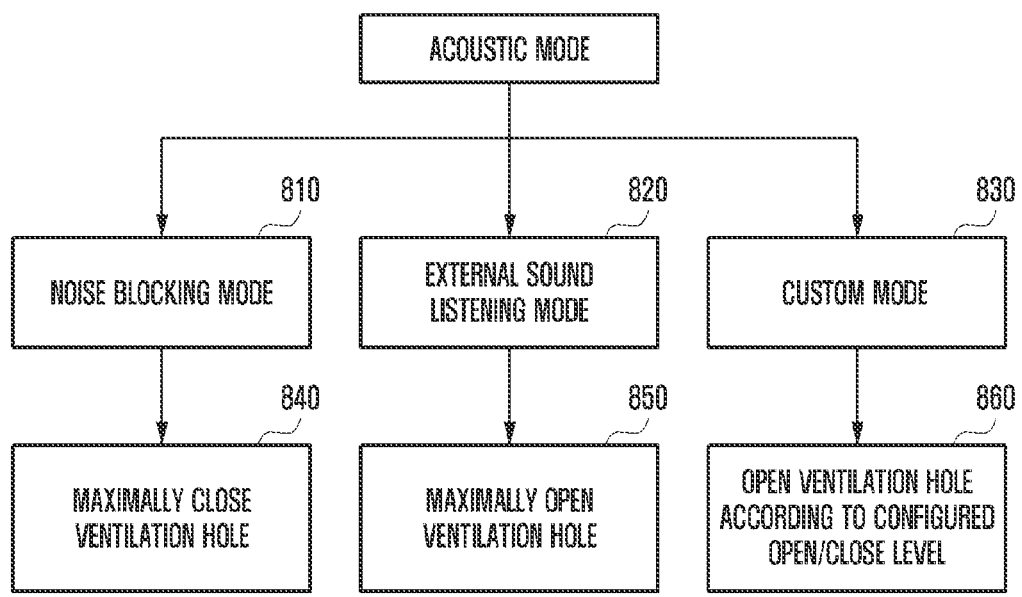
FIG. 8 is a diagram illustrating example control of a variable hole member according to an acoustic mode according to various embodiments.

FIG. 7 is a flowchart illustrating an example method of controlling a variable hole member according to various embodiments. FIG. 8 is a view illustrating an example method of controlling a variable hole member according to an acoustic mode according to various embodiments. Hereinafter, the reference numbers of FIG. 2 and FIGS. 3A, 3B and 3C will be used.

According to various embodiments, the electronic device 200 may include various acoustic modes. The acoustic mode of the electronic device 200 may be pre-configured by a manufacturer at a time of manufacturing the electronic device 200 or may be a mode arbitrarily configured by a user during a use of the electronic device 200. According to the acoustic mode, an output for each frequency (equalizer), an audio effect, a sound field effect of a sound output from the speaker may be changed. In addition, the acoustic mode may include a noise blocking mode 810 and an external sound listening mode 820.

According to various embodiments, in the noise blocking mode 810, the electronic device may perform an active noise canceling (ANC) operation. The electronic device 200 may output, through the speaker 260, an external sound obtained through the external microphone 212-1 configured to collect an external sound and a sound having opposite phase to the external sound so as to incite destructive interference between the external sound and the sound output from the speaker 260. Furthermore, a sound reflected from the user ear is received through the internal microphone 212-2 to feedback control the output for removal of the noise so as to conserve an audio signal received from the external electronic device and remove only the external noise.

According to various embodiments, in the external sound listening mode 820, the electronic device 200 may deliver a sound introduced into the external sound duct 230 to the user as it is without blocking the sound. In the external sound listening mode, the user may easily listen to the external sound.

According to various embodiments, the processor may identify a configured acoustic mode (710). The operation of identifying the configured acoustic mode by the processor may be performed according to various situations such that the electronic device 200 is activated from an inactivated state or connected to the external electronic device, or the acoustic mode configuration is changed through the various input interface 213 as shown in FIG. 2. In an embodiment, when the electronic device 200 satisfies a predetermined condition, the processor may change the acoustic mode of the electronic device 200 to the noise blocking mode 810 or the external sound listening mode 820. For example, when an input configured to stop the audio data playback is received from the user, the acoustic mode of the electronic device 200 may be changed to the external sound listening mode 820. For example, as the stopping of the audio data playback has lasted for a predetermined time, the acoustic mode of the electronic device 200 may be changed to the external sound listening mode 820.

According to various embodiments, the processor may control the variable hole member 300 according to the configured acoustic mode (720).

For example, when the acoustic mode is the noise blocking mode 810, the variable hole member 300 may be controlled to maximally close the ventilation hole 350 of the variable hole member 300 (840). In the noise blocking mode 810, the electronic device may control the variable hole member 300 for insulation of sound between the outside and the user ear in order to efficiently block the external noise. In the state in which the ventilation hole 350 of the variable hole member 300 is maximally closed, the introduction of the external sound may be minimized and/or reduced and thus the noise blocking mode 810 may be efficiently performed.

For another example, when the acoustic mode is the external sound listening mode 820, the variable hole member 300 may be controlled to maximally open the ventilation hole 350 of the variable hole member 300 (850). The external sound listening mode 820 is a mode for delivering an external sound to the user, and thus the electronic device may control the variable hole member 300 not to block the external sound introduced through the external sound duct 230. When the external sound is introduced through the ventilation hole 350 of the variable hole member 300, the user may easily listen to the external sound.

For another example, when the acoustic mode is a custom mode 830, the variable hole member 300 may be controlled to allow the ventilation hole 350 to be at a pre-configured open/close level (860). For example, the user may store a value desired by the user as the custom mode using the input interface 213 of the electronic device 200 or the external electronic device 200 connected to the electronic device 200. When the state in which the ventilation hole 350 is maximally closed is referred to as 100 and the state in which the ventilation hole 350 is maximally opened is referred to as 0, the user may set the open/close level to have a desired value within a range of 0-100. The opening and closing of the external sound duct 230 may affect a listening environment of the user. The external sound duct 230 may function as a duct, and therefore, sounds in specific frequencies may be strengthen or weaken according to the opening and closing of the external sound duct 230. The user may enjoy the sound according to his or her taste by storing the desired open/close level as the custom mode.

According to various embodiments, the processor may control the variable hole member 300 to gradually close the external sound duct 230 while a specific sound is playing. The processor may receive a stop commend and maintain the open/close level at a time point when the stop commend of the variable hole member 300 is received. Through such an operation, the user may easily check the open/close level suitable for the user's preference. The stop commend may be input through various input interface 213 of the electronic device 200 or the external electronic device 200 connected to the electronic device 200.

Figure 9A:
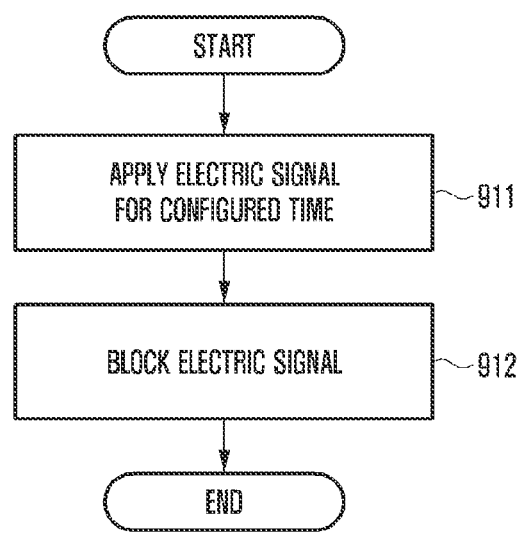
FIGS. 9A, 9B and 9C are flowcharts illustrating example operations of a variable hole member according to various embodiments.
Figure 9B:
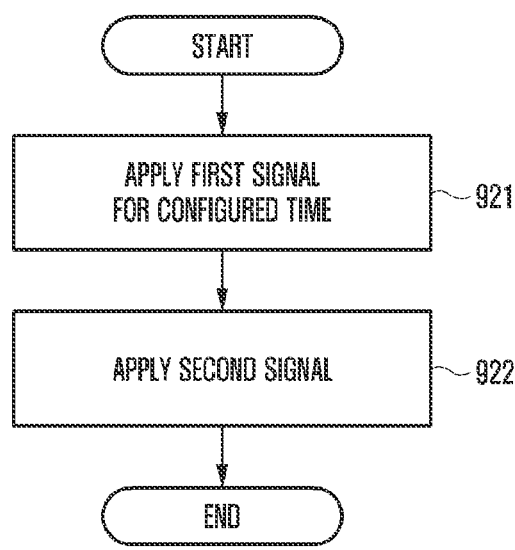
Figure 9C:
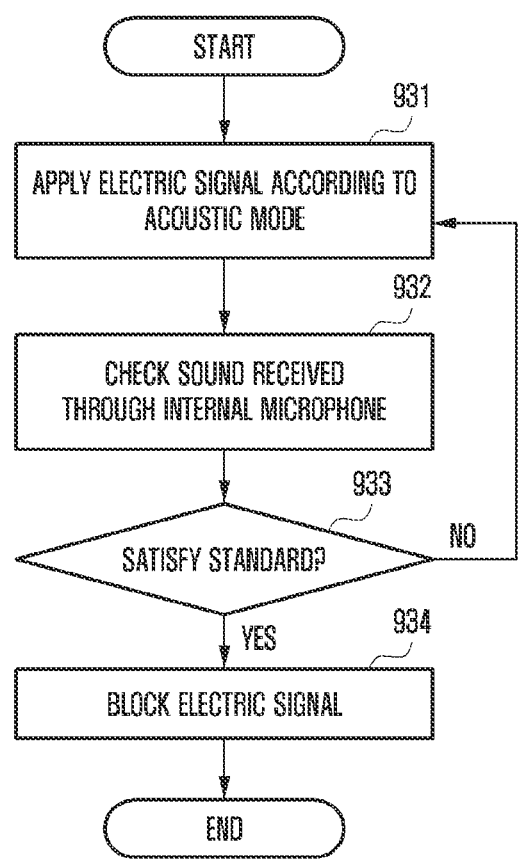

FIGS. 9A, 9B and 9C are flowcharts illustrating example operations of a variable hole member according to various embodiments.

According to various embodiments, as shown in FIG. 9A, the processor may apply an electric signal for a pre-configured (e.g., specified) time according to the configured acoustic mode (911), and block the electric signal (912). For example, in the case in which the deformable member 330 of the variable hole member 300 is deformed according to the application of an electric signal and then maintains the deformed state to a certain level even after the electric signal is blocked due to an attribute of a material for the deformable member, continuous application of an electric signal may not be necessary. The pre-configured time may be configured by a statistical analysis of amounts of time taken for the deformable member 330 to be deformed.

According to various embodiments, as shown in FIG. 9B, the processor may apply a first signal for a pre-configured or specified time according to the configured acoustic mode (921), and then apply a second signal after the pre-configured time has elapsed (922). In this case, the second signal may be a signal with a lower power consumption than the first signal. For example, when an electric signal is a voltage, the second signal may be a signal with a lower voltage than the first signal.

According to various embodiments, as shown in FIG. 9C, the processor may apply an electric signal according to the configured acoustic mode (931), and check a sound output from the speaker 260 using the internal microphone 212-2 included in the audio device (932). As such, the processor may compare the checked sound with a reference sound of the corresponding acoustic mode to determine whether a standard is satisfied (933). The reference sound may be referred to as a sound level expected in the configured acoustic mode. The reference sound may be referred as a frequency attribute of a sound (e.g., peak, maximum output frequency, minimum output frequency, waveform, etc.). The reference sound may vary according to a specific environment (e.g., indoors, outdoors, environment with strong echo, environment with weak echo). The processor may apply an electric signal until a difference between the reference sound and the checked sound is less than a pre-configured reference. When the difference between the reference sound and the checked sound is less than the configured reference (e.g., the standard is satisfied—Yes in operation 933), the processor may block an electric signal (934) or may apply a signal with a lower power consumption. An electric signal may be continuously applied if the difference between the reference sound and the checked sound is not less than the configured reference (e.g., the standard is not satisfied—No in operation 933).

According to various embodiments, the electronic device 200 may be separated into an electronic device (hereinafter, referred to as a first electronic device) worn on a right ear of the user and an electronic device (hereinafter, referred to as a second electronic device) worn on a left ear of the user. In the description above, the first electronic device and the second electronic device are not described as separate components, and only one of the first electronic device and the second electronic device may be provided with the external hole, the variable hole member, and the external sound duct.

In an embodiment, the electronic device 200 may include a sensor configured to detect a state of being worn on the user ear. For example, the sensor may include a sensor capable of detecting a distance from an object (e.g.: infrared sensor, laser sensor) and a sensor capable of detecting contact with an object (e.g.: touch sensor). Such a sensor may generate a signal by detecting a distance from the skin or contact with the skin according to wearing the electronic device on the user ear. The processor of the electronic device 200 may check which one of the first electronic device and the second electronic device is currently worn by detecting the signal generated by the sensor.

In an embodiment, the processor may perform the operations (operations for controlling the variable hole member according to the acoustic mode) described above only in the electronic device worn by the user. For example, when the user wears only the first electronic device, only the variable hole member of the first electronic device may be controlled, and the variable hole member of the second electronic device may not be controlled.

An electronic device (e.g., electronic device 101 of FIG. 1, electronic device 200 of FIG. 2) according to various example embodiments disclosed herein may include: a housing (e.g., housing 210 of FIG. 2), a speaker (e.g., speaker 260 of FIG. 3B) embedded in the housing, an acoustic duct (e.g., acoustic duct 240 of FIG. 3B) configured to transfer an output from the speaker to a user, an external hole (e.g.: external hole 220 of FIG. 3B) provided in the housing to connect to outside the electronic device, an external sound duct (e.g., external sound duct 230 of FIG. 3B) configured to transfer a sound introduced through the external hole to the user, and a variable hole member (e.g., variable hole member 300 of FIG. 3B) comprising a variable opening disposed in at least one of the external hole and the external sound duct, wherein the variable hole member may include a conductive member (e.g., conductive member 320 of FIG. 3B) comprising a conductive material configured to apply an electric signal, a ventilation hole (e.g., ventilation hole 350 of FIG. 3B) configured to allow a sound transferred from the external hole to pass therethrough, and a deformable member (e.g., deformable member 330 of FIG. 3B) comprising a deformable material configured to deform based on the electric signal to close at least a portion of the ventilation hole.

In addition, the deformable member of the variable hole member may include a conductive polymer material configured to expand or contract by an electric signal.

In addition, the variable hole member may include a body (e.g., body part 301 of FIG. 4A) configured to support the conductive member and the deformable member.

In addition, the body of the variable hole member may include a first plate (first plate 310 of FIG. 4A) and a second plate (second plate 340 of FIG. 4A) with the conductive member and the deformable member interposed therebetween.

In addition, the ventilation hole of the variable hole member may include an opening formed through the body part, the conductive member, and the deformable member.

In addition, the variable hole member my include a partition wall (e.g., partition wall member 410 of FIG. 4B) configured to guide a deformation direction of the deformable member to adjust the area of the opening formed through the deformable member by a deformation of the deformable member.

In addition, the partition wall of the variable hole member may surround the outer circumferential portion of the deformable member.

In addition, the conductive member of the variable hole member may include a first conduction part (e.g., first conduction part 520A of FIG. 5A) and a second conduction part (e.g.: second conduction part 520B of FIG. 5A) segmented from each other, wherein the first conduction part may be configured to apply a first signal to a first area (e.g., first area 530A of FIG. 5A) of a first surface (e.g., first surface 530-1 of FIG. 5A) of the deformable member in contact with the first conduction part, and the second conduction part may be configured to apply a second signal different from the first signal to a second area (e.g., second area 530B of FIG. 5A) different from the first area on the first surface of the deformable member.

In addition, the deformable member of the variable hole member may have an ellipse shape, wherein the first area of the deformable member may be an area corresponding to the major axis of the ellipse, and the second area of the deformable member may be an area corresponding to the minor axis of the ellipse.

An electronic device (e.g., electronic device 101 of FIG. 1, electronic device 200 of FIG. 2) according to various example embodiments disclosed herein may include: a housing (e.g., housing 210 of FIG. 2), a speaker (e.g., speaker 260 of FIG. 3B) embedded in the housing, an acoustic duct (e.g., acoustic duct 240 of FIG. 3B) configured to transfer an output from the speaker to a user, an external hole (e.g., external hole 220 of FIG. 3B) formed in the housing to connect to outside the electronic device, an external sound duct (e.g., external sound duct 230 of FIG. 3B) configured to transfer a sound introduced through the external hole to the user, and a variable hole member (e.g., variable hole member 300 of FIG. 3B) comprising a variable opening disposed in at least one of the external hole and the external sound duct, wherein the variable hole member may include a ventilation hole (e.g., ventilation hole 350 of FIG. 3B) configured to allow a sound transferred from the external hole to pass therethrough, a deformable member (e.g., deformable member 330 of FIG. 3B) comprising a deformable material configured to deform according to a pressure applied thereto to close at least a portion of the ventilation hole, and a pressing member (e.g., pressing member 620 of FIG. 6) comprising at least one actuator configured to press the deformable member.

In addition, the pressing members may be arranged with the deformable member interposed therebetween and be configured to press the deformable member based on an electric signal applied thereto.

In addition, the variable hole member my include a partition wall (e.g., partition wall member 602 of FIG. 6) configured to guide a deformation direction of the deformable member to adjust the area of the opening formed through the deformable member by a deformation of the deformable member.

In addition, the partition wall of the variable hole member may surround the outer circumferential portion of the deformable member.

An electronic device (e.g., electronic device 101 of FIG. 1, electronic device 200 of FIG. 2) according to various embodiments disclosed herein may include: an audio device including a speaker and a microphone, an external sound duct (e.g., external sound duct 230 of FIG. 3B) configured to transfer a sound introduced from outside the electronic device to a user, a variable hole member (e.g., variable hole member 300 of FIG. 3B) comprising a variable opening configured to close at least a portion of the external sound duct by an electric signal, and a processor (e.g., processor 120 of FIG. 1) operatively connected to the audio device and the variable hole member, wherein the processor is configured to: identify a configured acoustic mode and transmit a different electric signal to the variable hole member based on the acoustic mode, wherein the variable hole member is configured to open the external sound duct or close at least a portion of the external sound duct based on the acoustic mode in response to the electric signal.

In addition, the acoustic mode may include a noise blocking mode (e.g., noise blocking mode 810 of FIG. 8) and an external sound listening mode (e.g., external sound listening mode 820 of FIG. 8), wherein the processor is configured to: identify that the acoustic mode is the noise blocking mode and control the variable hole member to allow the variable hole member to close at least a part of the external sound duct, and identify that the acoustic mode is the external sound listening mode and control the variable hole member to allow the variable hole member to open the external sound duct.

In addition, the processor is configured to: apply an electric signal for a pre-configured time based on the configured acoustic mode, and block an electric signal.

In addition, the processor is configured to: apply a first electric signal to the variable hole member for a specified time based on the configured acoustic mode, and apply a second signal with a lower power consumption than the first electric signal.

In addition, the processor is configured to: apply an electric signal to the variable hole member based on the configured acoustic mode, check a sound output from the speaker through a microphone included in the audio device, recognize a sound reflected by the user ear, compare the checked sound with a reference sound with respect to the configured acoustic mode, and continuously apply the electric signal so that the difference between the checked sound and the reference sound is less than the specified reference.

In addition, the acoustic mode may further include a custom mode (e.g., custom mode 830 of FIG. 8) wherein an open/close level of the external sound duct is specified, wherein the processor is configured to: identify that the acoustic mode is the custom mode and control the variable hole member to allow the variable hole member to be in the specified open/close level.

In addition, the processor is configured to: apply an electric signal to the variable hole member to allow the variable hole member to gradually close the external sound duct while a sound is playing through the audio device, and receive a stop commend and block the electric signal.

The embodiments disclosed in the specification and the drawings are merely presented as examples to easily explain the technical features according to the example embodiments disclosed herein and to aid in understanding of the embodiments, and are not intended to limit the scope of the disclosure. Therefore, the scope of the disclosure should be understood as encompassing all changes or modifications derived from the technical ideas of the disclosure herein in addition to the various example embodiments disclosed herein. It will be further understood that any of the embodiment(s) described herein may be used in conjunction with any other embodiment(s) described herein.

What is claimed is:

1. An electronic device comprising:
    a housing;
    a speaker embedded in the housing;
    a first sound path configured to transfer an output from the speaker to a user;
    first hole formed in the housing;
    second sound path connected to the first hole configured to transfer a external sound introduced through the first hole from outside the electronic device to the user; and
    a variable hole member disposed in at least one of the first hole and the second sound path, the variable hole member comprising a conductive member comprising a conductive material, a deformable member comprising a deformable material, a first plate, and a second plate comprising a conductive material, wherein the conductive member and the deformable member are disposed between the first plate and the second plate, wherein the conductive member, the deformable member, the first plate, and the second plate form a second hole through which the external sound passes, and wherein a size of the second hole varies according to a deformation of the deformable member when an electric signal is applied to the deformable member by the conductive member.

2. The electronic device of claim 1, wherein the deformable member of the variable hole member comprises a conductive polymer material configured to expand or contract based on the electric signal.

3. The electronic device of claim 1, wherein the variable hole member comprises a partition wall configured to guide a deformation direction of the deformable member to adjust an area of an opening formed through the deformable member by a deformation of the deformable member.

4. The electronic device of claim 3, wherein the partition wall of the variable hole member surrounds an outer circumferential portion of the deformable member.

5. The electronic device of claim 1, wherein the conductive member of the variable hole member comprises a first conduction part and a second conduction part segmented from each other, wherein the first conduction part is configured to apply a first electric signal to a first area of a first surface of the deformable member in contact with the first conduction part, and the second conduction part is configured to apply a second electric signal different from the first electric signal to a second area, different from the first area, of the first surface of the deformable member.

6. The electronic device of claim 5, wherein the deformable member of the variable hole member has an ellipse shape, wherein the first area of the deformable member is an area corresponding to a major axis of the ellipse, and wherein the second area of the deformable member is an area corresponding to a minor axis of the ellipse.

* * * * *